(12) United States Patent
Xiu

(10) Patent No.: US 9,379,714 B1
(45) Date of Patent: Jun. 28, 2016

(54) CIRCUITS AND METHODS OF TAF-DPS VERNIER CALIPER FOR TIME-OF-FLIGHT MEASUREMENT

(71) Applicant: Liming Xiu, Plano, TX (US)

(72) Inventor: Liming Xiu, Plano, TX (US)

(73) Assignee: Liming Xiu, Plano, TX (US)

( * ) Notice: Subject to any disclaimer, the term of this patent is extended or adjusted under 35 U.S.C. 154(b) by 0 days.

(21) Appl. No.: 14/726,666

(22) Filed: Jun. 1, 2015

(51) Int. Cl.
| | |
|---|---|
| *G04F 10/00* | (2006.01) |
| *H03K 21/02* | (2006.01) |
| *G01S 7/486* | (2006.01) |
| *G01S 7/526* | (2006.01) |
| *G01S 7/285* | (2006.01) |
| *H03L 7/191* | (2006.01) |
| *H03K 23/42* | (2006.01) |

(52) U.S. Cl.
CPC .............. *H03K 21/026* (2013.01); *G01S 7/285* (2013.01); *G01S 7/4865* (2013.01); *G01S 7/526* (2013.01); *H03K 23/42* (2013.01); *H03L 7/191* (2013.01)

(58) Field of Classification Search
CPC ....................................................... G04F 10/00
See application file for complete search history.

(56) References Cited

U.S. PATENT DOCUMENTS

| | | | | |
|---|---|---|---|---|
| 6,411,075 B1* | 6/2002 | Battiston | ................ | G01R 23/14 324/76.23 |
| 9,134,752 B2* | 9/2015 | Yasuda | ..................... | G06F 1/04 |

* cited by examiner

*Primary Examiner* — Hai L Nguyen

(57) ABSTRACT

Circuits for measuring TOF between two electrical signals comprises 1) a slow TAF-DPS clock signal generator for generating a slow clock signal, a fast TAF-DPS clock signal generator for generating a fast clock signal, said slow TAF-DPS clock signal generator comprises a gated ring oscillator and a TAF-DPS frequency synthesizer, said fast TAF-DPS clock signal generator comprises a gated ring oscillator and a TAF-DPS frequency synthesizer; 2) a phase detector for receiving said slow and fast clock signals and detecting point-of-coincidence between said slow and fast clock signals; 3) a first digital counter driven by said slow clock signal for storing the number of slow clock cycles and a second digital counter driven by said fast clock signal for storing the number of fast clock cycles; 4) a calibrator for calibrating said gate ring oscillators; 5) a calculation block for calculating TOF measurement result. Methods of using a slow TAF-DPS clock generator and a fast TAF-DPS clock generator for measuring TOF between two electrical signals are also disclosed.

19 Claims, 8 Drawing Sheets

CIRCUITS AND METHODS OF TAF-DPS VERNIER CALIPER FOR TIME-OF-FLIGHT MEASUREMENT

FIELD OF THE INVENTION

The present invention generally relates to the field of integrated circuit. More specifically, embodiments of the present invention pertain to circuits and methods of using one kind of frequency synthesizer, Time-Average-Frequency Direct Period Synthesis, to measure Time-of-Flight (TOF).

DISCUSSION OF THE BACKGROUND

Time-of-Flight (TOF) measures the time that it takes for an object, particle or acoustic/electromagnetic to travel a distance through a medium. This measurement can be used as a way to measure velocity or path-length through the given medium, or as a way to learn about the particle or the medium (such as composition or flow rate). The traveling object may be detected directly (e.g., ion detector in mass spectrometry) or indirectly (e.g., light scattered from an object in laser Doppler velocimetry).

In ultrasonic flow meter measurement, in order to estimate total flow velocity, TOF is used to measure the speed of a signal propagating upstream, and downstream, of flow of a media. This measurement is made in a collinear direction with the flow. In planar Doppler velocimetry (optical flow meter measurement), TOF measurements are made perpendicular to the flow by timing when individual particles cross two or more locations along the flow. In optical interferometry, the path-length difference between sample and reference arms can be measured by TOF methods, such as frequency modulation followed by phase shift measurement. Such methods are used in laser radar and laser tracker systems for medium to long range distance measurement.

Refer to FIG. 1A, an exemplary sensor system has a transmitter 110 and a receiver 120. A target 130 is located in front of the sensor by certain distance. The sensor system is used to measure this distance between the sensor and the target. An acoustic or electromagnetic wave 111 is transmitted from the transmitter. The wave is reflected by the target. Some portion of the reflected wave 121 is received by the receiver. The TOF is the time elapsed between the moment that the wave is being transmitted and the moment of the wave being received. The distance can be calculated from the measured TOF since the speed of the wave is known.

In FIG. 1B, an electric circuit called Time-to-Digital Converter (TDC) is used to measure the time elapsed between the transits of signals Start and Stop. Signal Start is delayed by a plurality of n delay lines. The delay lines have time delays of $t_0+\sigma, t_0+2\cdot\sigma, t_0+3\cdot\sigma, \ldots, t_0+n\cdot\sigma$, respectively. The ends of the delay lines are connected to the data inputs of a plurality of n flip-flops. The flip-flops are clocked by the Stop signal. The outputs of the flip-flops are fed to a decoder circuit. The value represented by these outputs is the time duration between Start and Stop. The time resolution is $\sigma$. In TOF measurement discussed in FIG. 1A, the Start signal represents the moment that the transmitter starts to transmit the wave. The Stop signal is the moment of the wave reaching the receiver.

FIG. 1C is another type of TDC where the Start signal is passed though a delay line made of a series of identical delay cells. The time delay associated with each delay cell is $\sigma$. Signals are tapped out from each of those delay cells and fed to a group of flip-flops. The flip-flops are clocked by the Stop signal. The outputs of the flip-flops are fed to a decoder whose output value represents the TOF between Start and Stop. The time resolution is $\sigma$. FIG. 1D illustrates a third type of TDC where both the Start and Stop signals are passed through delay lines. The two delay lines are however made of delay cells of slightly different time delays, $\sigma_1$ and $\sigma_2$, respectively. Thus the time resolution is improved to $\sigma_1-\sigma_2$, assuming $\sigma_1>\sigma_2$.

One problem with the method of using TDC to measure TOF is that the absolution value of the TOF measurement is difficult to be known in high accuracy. To get high accuracy on TOF measurement, the precise delay values of $\sigma$, $\sigma_1$, $\sigma_2$ must be known. This is difficult unless the delay line is locked to a known frequency by PLL or DLL for the cases of FIG. 1C and FIG. 1D. For the case of FIG. 1B, high accuracy is virtually impossible since the delay value depends on the capacitor C's capacitance value which could varies in large degree under different PVT (process, voltage, temperature) condition. For these reasons, TDC is not good for TOF measurement. However, they are useful to detect the relative phase different between two signals. This is especially applicable for phase detector in Phase Locked Loop design.

As discussed previously, the time resolution of TDC is limited by cell delay a. It can be improved by the method of using delay difference of two delay cells: $\sigma_1-\sigma_2$. The principle of using the delay difference approach to measure TOF can be illustrated by the example of using Vernier caliper to measure distance. Refer now to FIG. 2, a Vernier caliper is used to measure distance. It has two scales: the main scale 210 and the Vernier scale 220. The Vernier scale is constructed in such a way that its graduations are at a slightly smaller spacing than those on the main scale. When the zero point of the Vernier scale is coincident with the start 230 of the main scale, none but the last graduation in Vernier scale coincides with a graduation 240 on the main scale. Therefore, N graduations of the Vernier scale cover N−1 graduations of the main scale. N is defined in this application as "Vernier factor". In Vernier scale, its graduation is spaced at a constant fraction of that of main scale. For the Vernier caliper displayed in FIG. 2, N=50. Thus, the measurement resolution is 1 mm/50=0.02 mm.

For an example of N=10, the marks on the Vernier scale is spaced nine tenths of those on the main scale. If the two scales are put together with zero points aligned, the first mark on the Vernier scale is one tenth short of the first main scale mark, the second two tenths short, and so on up to the ninth mark which is misaligned by nine tenths. Only when a full ten marks are counted is there an alignment since the tenth mark is ten tenths (a whole main scale unit short). At this time, the tenth mark on Vernier scale aligns with the ninth mark on the main scale. Now if the Vernier is moved by a small amount, for example one tenth of the main scale, the only pair of marks that come into alignment are the first pair since these were the only ones originally misaligned by one tenth. If it is moved by two tenths, the second pair aligns since these are the only ones originally misaligned by that amount. If it is moved by five tenths, the fifth pair aligns; and so on. For any movement, only one pair of marks aligns and that pair shows the value between the marks on the main scale.

Refer now to FIG. 3, the Vernier method is applied to build an electronic system 300 of measuring TOF. System 300 has two oscillators: a slow oscillator 330 and a fast oscillator 340 with oscillation frequencies $f_1$ and $f_2$, respectively. Their output signals, slow clock 331 and fast clock 341, are fed to a phase detector 350. System 300 has two digital counters: counter#1 360 and counter#2 370. The counters are driven by signals slow clock 331 and fast clock 341, respectively. When the edges of slow clock and fast clock are aligned, a point-of-coincidence is reached. At this moment, the phase detector 350 generates a signal Reset 351 that is used to read out the counters' contents, $n_1$ 361 and $n_2$ 371, and then reset the counter#1 360 and counter#2 370.

System 300 is used to measure the time elapsed between signals Start 310 and Stop 320. The time elapsed is the TOF whose value is $\tau$ 380. Signal Start 310 is used to enable the slow oscillator 330 and signal Stop is used to enable the fast oscillator 340. FIG. 4 shows exemplary waveforms. As shown, the slow clock 430 with period $T_1$ is enabled by Start 410 and the fast clock 440 with period $T_2$ is enabled by Stop 420. The TOF is the time difference between Start 410 and Stop 420. The value of TOF is $\tau$ 460. When the point-of-coincidence 450 is reached, equation (1) is established and TOF value $\tau$ can be calculated.

$$\tau + n_2 \cdot T_2 = n_1 \cdot T_1 \Rightarrow \tau = n_1 \cdot T_1 - n_2 \cdot T_2 = n_1/f_1 - n_2/f_2 \quad (1)$$

$$\tau = (n_1 - n_2)/(f_1/df) + n_1 \cdot df/[f_1 \cdot (f_1 + df)] = (n_1 - n_2)/f_2 + n_1 \cdot df/(f_1 \cdot f_2) \quad (2)$$

If the fast clock's frequency $f_2$ is expressed as $f_2 = f_1 + df$, the TOF value $\tau$ can be derived as in (2). From (2), it can be seen that high measurement resolution on $\tau$ can be achieved by small df. Similar to the case of Vernier caliper where the larger the Vernier factor N is, the higher the measurement resolution will be. In the case of system of 300, the smaller the df is, the higher the measurement resolution will be. The key requirement for system 300 is therefore the frequency generation for the slow and fast oscillators. Their frequencies must be generated in high accuracy and the frequency granularity of the frequency generators must be made as small as possible.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

It is therefore an object of the present invention to use the method of Time-Average-Frequency direct period synthesis (TAF-DPS) to create two clock generators with highly tunable frequencies. It is a further object of the present invention to use said two clock generators for generating two clock signals with slightly different frequencies and use said clock signals to measure TOF through applying Vernier method.

The present invention relates to circuits and systems that use TAF-DPS to create the functional clock signals for measuring TOF. Thus, the present invention can take advantage of the powerful frequency generation capability provided by TAF-DPS. This can result in very fine frequency granularity that can be used to differentiate the two said clock generators. This fact subsequently improves the resolution of the TOF measurement.

DETAILED DESCRIPTION

Figure 1A:
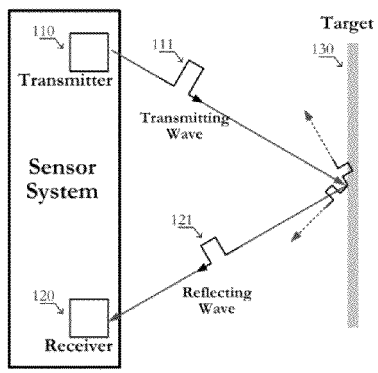
FIG. 1A is a diagram showing the scheme of using a transmitter and receiver pair for measuring TOF.
Figure 1B:
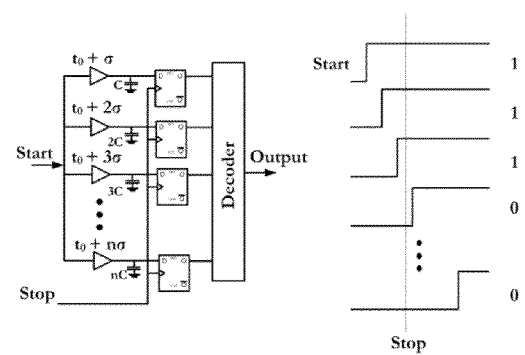
FIG. 1B is an electrical diagram, in block form, showing the scheme of evaluating the time delay between two signals using a RC-delay based Time-to-Digital Converter.
Figure 1C:
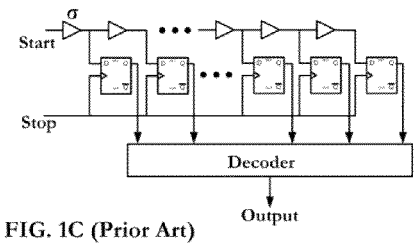
FIG. 1C is an electrical diagram, in block form, showing the scheme of evaluating the time delay between two signals using a delay-chain Time-to-Digital Converter.
Figure 1D:
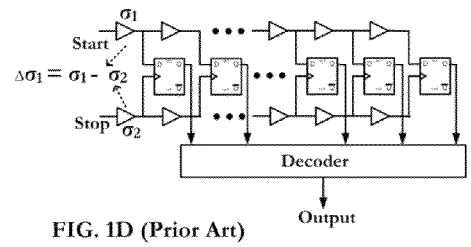
FIG. 1D is an electrical diagram, in block form, showing the scheme of evaluating the time delay between two signals using a two-delay-chain Time-to-Digital Converter.
Figure 2:
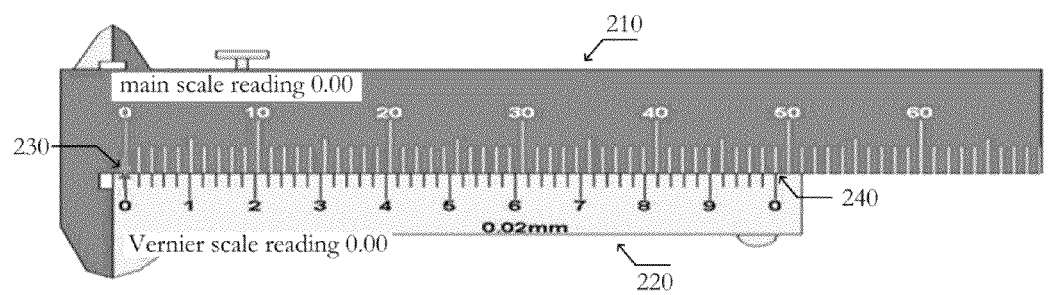
FIG. 2 is an exemplary Vernier caliper for measuring distance.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the arts of VLSI-circuit-and-system design to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or signal processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, flip-flops, other such information storage, transmission or display devices, etc.) into other data similarly represented as physical quantities within other components of the same or a different system or architecture.

Furthermore, for the sake of convenience and simplicity, the terms "clock," "time," "rate," "period," "frequency" and grammatical variations thereof are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (each of which may refer to direct or indirect connections, couplings, and communications), as may the terms "electrical path," "channel," "wire" (each of which may refer to a physical channel for transferring electrical signal), as may the terms "signal," "pulse," "pulse train," "a sequence of digital data" (each of which may refer to an electrical signal that has only two values: zero and one), as may the terms "input," "input port," "input pin" (each of which may refer to a physical channel for receiving data), as may the terms "output," "output port," "output pin" (each of which may refer to a physical channel for sending data), but these terms are also generally given their art-recognized meanings.

Figure 5:
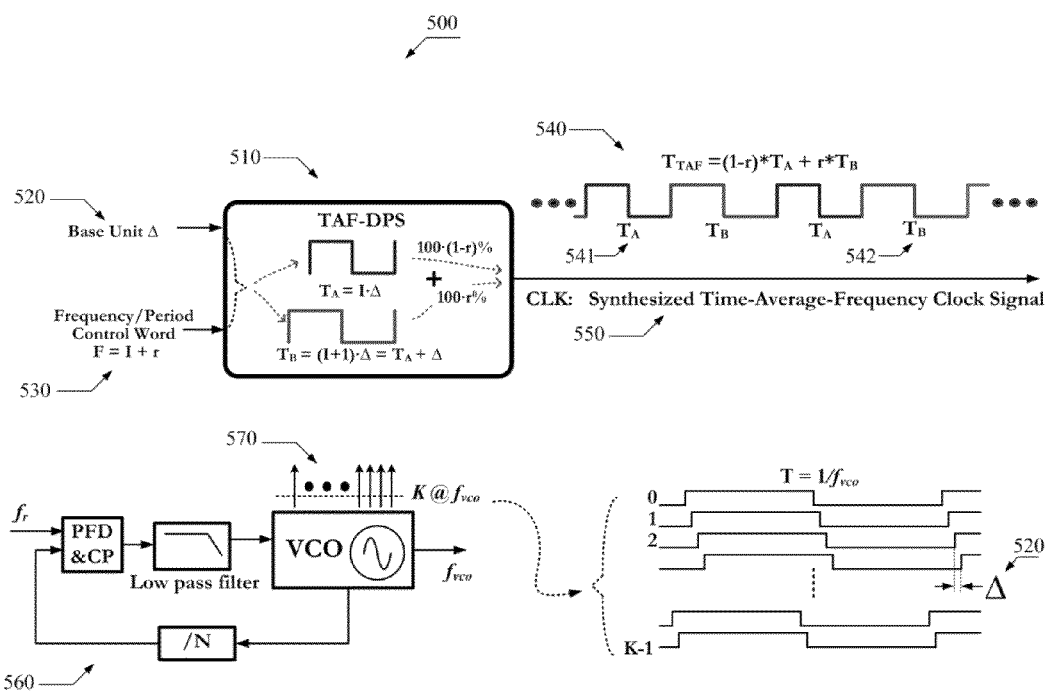
FIG. 5 is an electrical diagram, in block form, showing the general architecture of TAF-DPS.

Referring now to FIG. 5, the principle of TAF-DPS clock generator 500 will be explained. A TAF-DPS frequency synthesizer 510 has two inputs: a base unit Δ 520 and a frequency/period control word 530 F=I+r where I is an integer of greater than one and r is a fraction. TAF-DPS 510 has one output CLK 550. It is the synthesized Time-Average-Frequency clock signal. Starting from the base unit 520, the TAF-DPS creates two types of cycles $T_A$=I·Δ and $T_B$=(I+1)·Δ. Its output CLK is a clock pulse train 540 that contains both type of cycles $T_A$ 541 and $T_B$ 542. They are used in an interleaved fashion. The fraction r represents the occurrence possibility of cycle type $T_B$ (and thus it also determines the possibility of $T_A$).

The base unit Δ 520 is usually generated from a multi-stage VCO (voltage controlled oscillator) 570. The Δ is the time span between any two adjacent VCO outputs. The VCO can be locked to a reference frequency of known frequency through a Phase Locked Loop (PLL) 560. As a result, the VCO frequency $f_{vco}$ is a known value. In FIG. 5, VCO 570 has K phase-evenly-spaced outputs where K is an integer of greater than one. Consequently, the base unit Δ can be calculated using equation (3).

$$\Delta = T_{VCO}/K = 1/(K \cdot f_{vco}) \quad (3)$$

Figure 6:
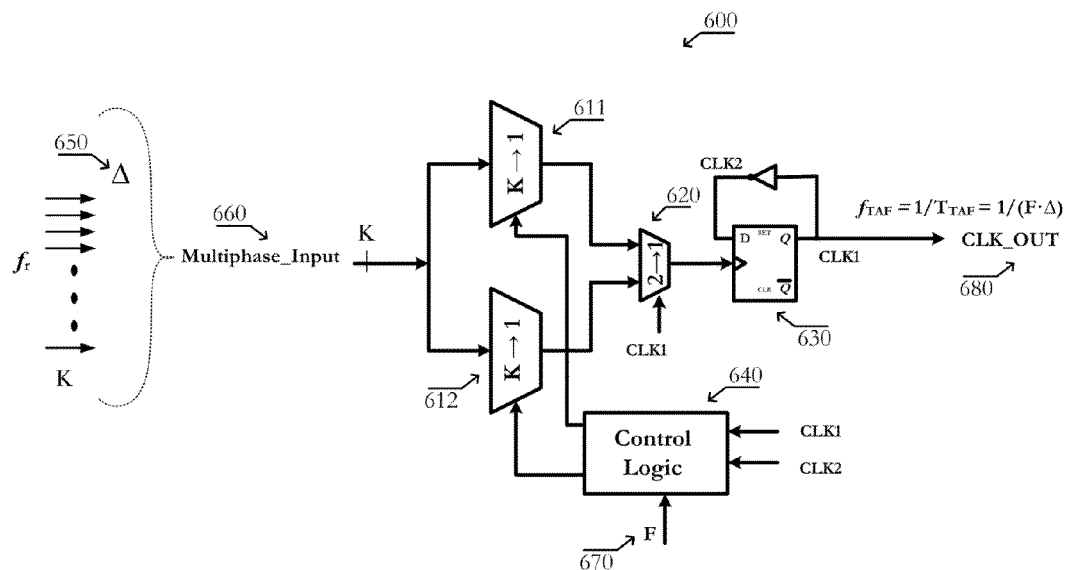
FIG. 6 is an electrical diagram, in block form, showing the circuit structure of TAF-DPS.

Referring now to FIG. 6, in one embodiment of present invention, an exemplary TAF-DPS frequency synthesizer 600 comprises two K→1 multiplexers 611 and 612, a 2→1 multiplexer 620, a D-type flip-flop configured as toggle flip-flop 630 and a control logic block 640. The TAF-DPS frequency synthesizer 600 takes signal Multiphase_Input 660 as an input. Multiphase_Input 660 has K evenly-spaced phases with frequency $f_r$. The time span between any two logically adjacent phases is Δ 650 and it is calculated as Δ=$T_r$/K=1/(K·$f_r$). The TAF-DPS frequency synthesizer 600 takes another signal F 670 as input to control its output frequency (or period). The TAF-DPS frequency synthesizer 600 has an output signal CLK_OUT 680 with frequency $f_{TAF}$.

The TAF-DPS output's period can be calculated as $T_{TAF}$=F·Δ. The control word F can take value in the range of [2, 2K]. When only integer is used in control word F, the TAF-DPS output is a signal of conventional frequency. When control word F contains fractional part, the TAF-DPS uses Time-Average-Frequency concept in its output signal. The Time-Average-Frequency concept is explained in chapter 3 of reference [1]. The working principle of TAF-DPS can be found in chapter 4 of reference [1]. TAF-DPS frequency synthesizer 600 can function as the circuit block 510 in FIG. 5. The signal F 670 functions as the control word F 530 in FIG. 5. The signal CLK_OUT 680 functions as the signal CLK 550 in FIG. 5.

The signal CLK_OUT 680 output frequency $f_{TAF}$ can be calculated using (4) (please see chapter 4 of reference [1]). When PLL 560 of FIG. 5 is used as the circuit for generating base unit Δ, equation (5) can be derived from (3) and (4).

$$f_{TAF} = 1/T_{TAF} = 1/(F \cdot \Delta) \quad (4)$$

$$f_{TAF} = (K/F) \cdot f_{vco} \quad (5)$$

Figure 7:
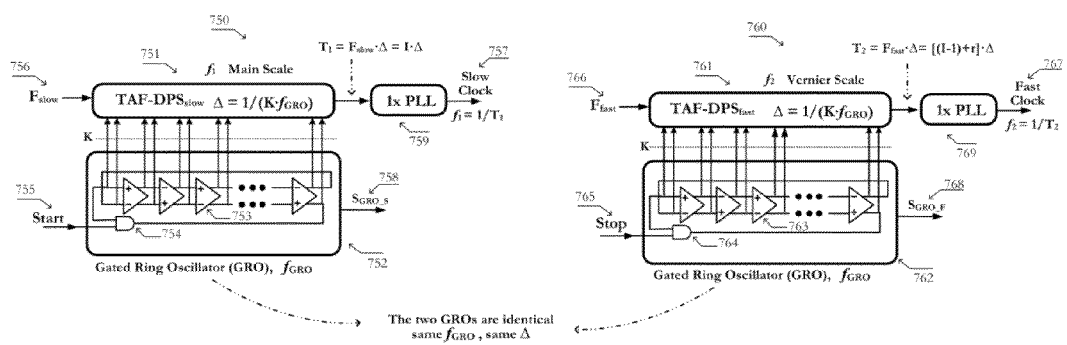
FIG. 7 is an electrical diagram, in block form, illustrating an embodiment of present invention of using TAF-DPS Vernier caliper to create two clock signals of slightly different frequencies.

Referring now to FIG. 7, an embodiment implementing the TAF-DPS Vernier Caliper for generating two signals of slightly different frequencies according to the present invention will be explained. Clock generator 750 comprises a TAF-$DPS_{slow}$ 751, a Phase Locked Loop with a dividing ratio of 1 (1×PLL) 759, and a Gated Ring Oscillator (GRO) 752. GRO 752 comprises a plurality of delay stages 753 that can be either differential or single-ended. The delay stages are configured as a ring oscillator with an oscillation enabling cell 754. One input of the enabling cell 754 is connected to a signal Start 755. The state of the Start 755 controls the on-and-off of the oscillation. A "high" state enables the oscillation and a "low" state disables the oscillation, or vice versa. The GRO 752 has K phase-evenly-spaced outputs where K is an integer of greater than one. The time difference between any two adjacent phases can be calculated as Δ=1/(K·$f_{GRO}$) where $f_{GRO}$ is the oscillation frequency of GRO 752. These outputs are fed to TAF-$DPS_{slow}$ 751. The GRO 752 has an output $S_{GRO\_S}$ 758 delivered from one of the delay stage's output. $S_{GRO\_S}$ 758 can also be one of the members of said K phase-evenly-spaced outputs. TAF-$DPS_{slow}$ 751 has an input for receiving frequency control word $F_{slow}$ 756. It functions as the main scale of TAF-DPS Vernier caliper. Its frequency (period) is $T_1$=$F_{slow}$·Δ. The frequency (period) value is $T_1$=I·Δ when $F_{slow}$ takes the value of I where I is an integer of greater than one. The output from TAF-$DPS_{slow}$ 751 is fed to the 1×PLL 759. The output of 1×PLL 759 is the signal Slow Clock 757.

Clock generator 760 comprises a TAF-DPS$_{fast}$ 761, a 1×PLL 769 and a Gated Ring Oscillator (GRO) 762. GRO 762 is structurally identical to GRO 752. It comprises a plurality of delay stages 763. The delay stages are configured as a ring oscillator with an oscillation enabling cell 764. One input of the enabling cell 764 is connected to a signal Stop 765. The state of the Stop signal 765 controls the on-and-off of the oscillation. A "high" state enables the oscillation and a "low" state disables the oscillation, or vice versa. The GRO 762 has K phase-evenly-spaced outputs where K is an integer of greater than one. The time difference between any two adjacent phases can be calculated as $\Delta=1/(K \cdot f_{GRO})$ where $f_{GRO}$ is the oscillation frequency of GRO 762 and GRO 752 since they are structurally identical. These outputs are fed to TAF-DPS$_{fast}$ 761. The GRO 762 has an output $S_{GRO\_F}$ 768 delivered from one of the delay stage's output. $S_{GRO\_F}$ 768 can also be one of the members of said K phase-evenly-spaced outputs. TAF-DPS$_{fast}$ 761 has an input for receiving frequency control word $F_{fast}$ 766. It functions as the Vernier scale of TAF-DPS Vernier caliper. Its frequency (period) is $T_2=F_{fast} \cdot \Delta$. The frequency (period) value is $T_2=[(I-1)+r] \cdot \Delta$ when $F_{fast}$ takes the value of $(I-1)+r$ where I is an integer of greater than one and r is a fraction. The output from TAF-DPS$_{fast}$ 761 is fed to the 1×PLL 769. PLL 769 is structurally identical to PLL 759. The 1×PLL converts the Time-Average-Frequency signal outputted from TAF-DPS$_{fast}$ 761 to a conventional frequency signal. The output of 1×PLL 769 is the signal Fast Clock 767.

Figure 4:
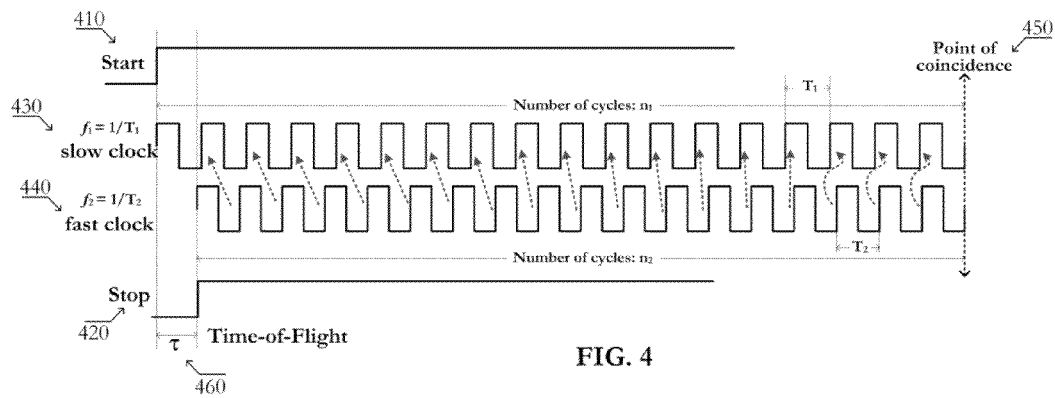
FIG. 4 is a diagram showing the waveforms of using two oscillators of slightly different frequencies for measuring TOF.

$T_1$ functions as the graduation of main scale in TAF-DPS Vernier caliper and $T_2$ is the graduation of Vernier scale. The Vernier factor N can be found using the principle that N graduations on Vernier scale covers the length (the time duration) of N−1 graduations on main scale. N is an integer. The calculation is carried out in (6) and the result is expressed in (7). From (7), it is understood that the TAF-DPS Vernier caliper's resolution is programmable since its Vernier factor N can be changed by the values of I and r. In TAF-DPS circuit, the I and r are user inputs. Table I provides some numerical examples. From this table, it is seen that TAF-DPS Vernier caliper possesses the capability of producing very fine measurement resolution.

$$N \cdot T_2=(N-1) \cdot T_1 \rightarrow N \cdot [(I-1)+r] \cdot \Delta=(N-1) \cdot I \cdot \Delta \quad (6)$$

$$N=I/(1-r) \quad (7)$$

clock cycles. This is the TOF measurement result obtained by directly using a digital counter. Its time resolution is the slow clock cycle. It is the "integer part" of the TOF measurement. The second part $(1-r) \cdot n_2 \cdot \Delta$ is the resolution achieved beyond the digital counter. It is the "fractional part" of the measurement that is made possible by the Vernier method. It is the sub-T resolution. In other words, it is the time resolution which cannot be reached by using digital counter. A special case is $n_1=n_2=n$ and $r=0$. In this case, $\tau=n \cdot \Delta$. This situation is exactly what is illustrated in FIG. 4. In this case, the resolution on measuring $\tau$ is $\Delta$, which is smaller than $T_1$ or $T_2$ (i.e. it is sub-T resolution). When $r \neq 0$, it is possible that the value of $(1-r) \cdot n_2 \cdot \Delta$ be smaller than $\Delta$. In circuit implementation, $\Delta$ usually represents one gate delay. Therefore, in TAF-DPS Vernier caliper, the resolution can reach sub-$\Delta$ (i.e. the TOF measurement resolution $res(\tau)<\Delta$) by using appropriate value for r.

$$N_{cal}=f_{GRO}/f_{cal}=T_{cal}/T_{GRO}=T_{cal}/(K \cdot \Delta)= \\ 1/(K \cdot \Delta \cdot f_{cal}) \rightarrow \Delta=1/(K \cdot N_{cal} \cdot f_{cal}) \quad (10)$$

$$\tau=[(n_1-n_2) \cdot I+(1-r) \cdot n_2]/(K \cdot N_{cal} \cdot f_{cal}) \quad (11)$$

In practice, the value of $\Delta$ might not be precisely known since the GROs are free-run. In circuit design, the range of the GRO oscillation frequency can be controlled and its value can be estimated. However, at any given moment, its precise value is difficult to be known for sure. For this reason, a reference signal of known frequency has to be used to calibrate it. In system, a stable reference frequency $f_{cal}$ can be incorporated to calibrate the $F_{GRO}$. Within one cycle of $T_{cal}$, the number of pulses $N_{cal}$ of $T_{GRO}$ can be counted. In some cases, more cycles of $T_{cal}$ can be used to improve the accuracy of calculating $N_{cal}$ by using the average of several $N_{cal}$ values. $\Delta$ can be calculated from (10). Subsequently, the absolution value of TOF measurement $\tau$ is derived in (11).

Exemplary TAF-DPS Vernier Caliper configuration #1 is now described. In this case, no fraction is used in the frequency control word $F_{fast}$. Assume that the gated ring oscillators 752 and 762 run at frequency of $f_{GRO}=200$ MHz ($T_{GRO}=5$ ns). Further assume that, inside each GRO, there are 16 differential stages (K=32). This leads to $\Delta=T_{GRO}/32=156.25$ ps. For TAF-DPS$_{slow}$ 751, frequency control word $F_{slow}$ 756 takes value of $F_{slow}=I=50$. This results in $T_1=50 \cdot \Delta=7.8125$ ns. For TAF-DPS$_{fast}$ 761, frequency control

TABLE I

The Vernier factor N in TAF-DPS Vernier caliper

| | $(1-r)=2^{-0}$ | $(1-r)=2^{-1}$ | $(1-r)=2^{-2}$ | $(1-r)=2^{-4}$ | $(1-r)=2^{-8}$ | $(1-r)=2^{-16}$ | $(1-r)=2^{-24}$ |
|---|---|---|---|---|---|---|---|
| I = 8 | 8 | 16 | 32 | 128 | 2048 | 524288 | 134217728 |
| I = 16 | 16 | 32 | 64 | 256 | 4096 | 1048576 | 268435456 |
| I = 32 | 32 | 64 | 128 | 512 | 8192 | 2097152 | 536870912 |
| I = 64 | 64 | 128 | 256 | 1024 | 16384 | 4194304 | 1073741824 |

$$\tau=n_1 \cdot T_1-n_2 \cdot T_2=n_1 \cdot I \cdot \Delta-n_2 \cdot [(I-1)+r] \cdot \Delta \quad (8)$$

$$\tau=(n_1-n_2) \cdot I \cdot \Delta+(1-r) \cdot n_2 \cdot \Delta=(n_1-n_2) \cdot T_1+(1-r) \cdot n_2 \cdot \Delta \quad (9)$$

Figure 3:
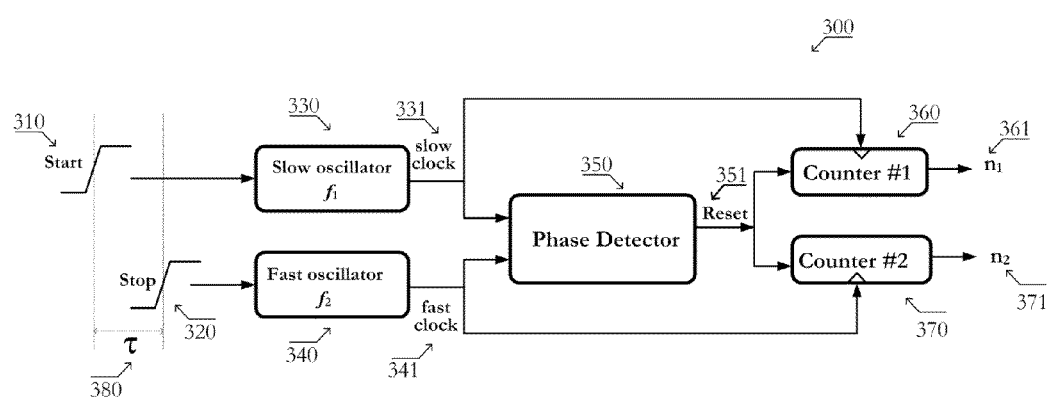
FIG. 3 is an electrical diagram, in block form, showing the principle of using two oscillators of slightly different frequencies for measuring TOF.

Clock generator 750 can function as the slow oscillator 330 in FIG. 3 and clock generator 760 can function as the fast oscillator 340 in FIG. 3. Refer now back to FIG. 4 and equation (1), the principle of using TAF-DPS Vernier caliper to measure TOF will now be explained. The TOF can be measured by using the calculations carried out in (8) and (9). Some observations on resolution can be made as follow. In (9), the first part $(n_1-n_2) \cdot T_1$ represents the number of slow word $F_{fast}$ 766 takes value of $F_{fast}=I-1=49$. This results in $T_2=49 \cdot \Delta=7.65625$ ns. The Vernier factor in this configuration can be calculated as N=I=50. If the calibration frequency is chosen as $f_{cal}=32.768$ KHz ($T_{cal}=30.5176$ ms), the $N_{cal}$ is expected to be in the neighborhood of 6103. Three counters could be used for holding the values of $n_1$, $n_2$ and $N_{cal}$.

Table II gives several examples of hypothetic TOF measurements. They can be used to illustrate the working mechanism of this method. There are six different TOFs measured in this table. For each measurement, the TOF measurement $\tau$ comprises two parts: $\tau=\tau_{int}+\tau_{frac}$. It is worth to mention that the base unit for TOF measurement in this approach is $\Delta$. The two scales are $T_1=50\cdot\Delta$ (the main scale) and $T_2=49\cdot\Delta$ (the Vernier scale). However, the $\Delta$ is not explicitly used in the calculation. It is indirectly included in the calculation through $f_{GRO}$ and $f_{cal}$.

TABLE II

TOF measurements from TAF-DPS Vernier caliper configuration #1

| | $n_1 = 10000, n_2 = 38$ | | $n_1 = 9, n_2 = 9$ | |
|---|---|---|---|---|
| | Meas. integer part, $\tau_{int}$ | Meas. fractional part $\tau_{frac}$ | Meas. integer part $\tau_{int}$ | Meas. fractional part $\tau_{frac}$ |
| $f_{GRO}$ = 200 MHz | 9962 $f_{slow}$ cycles | $38\Delta^1$ | zero $f_{slow}$ cycle | $9\Delta$ |
| $N_{cal}$ = 6103 | 77.83 us | 5.9 ns | 0 us | 1.41 ns |
| $f_{GRO}$ = 175 MHz | 9962 $f_{slow}$ cycles | $38\Delta$ | zero $f_{slow}$ cycle | $9\Delta$ |
| $N_{cal}$ = 5340 | 88.96 us | 6.8 ns | 0 us | 1.61 ns |
| $f_{GRO}$ = 225 MHz | 9962 $f_{slow}$ cycles | $38\Delta$ | zero $f_{slow}$ cycle | $9\Delta$ |
| $N_{cal}$ = 6866 | 69.19 us | 5.3 ns | 0 us | 1.25 ns |

$^1T_1 = I\cdot\Delta = 50\Delta$ is the size of a full cycle of the slow clock. Thus, this number is called the fractional part of the measurement since $38\Delta$ is smaller than one $T_1$.

Exemplary TAF-DPS Vernier Caliper configuration #2 is now described. In this case, a fraction is used in frequency control word $F_{fast}$ 766. For TAF-DPS$_{slow}$ 751, its frequency control word $F_{slow}$ take the value of $F_{slow}$=I=50. This leads to $T_1=50\cdot\Delta=7.8125$ ns. For TAF-DPS$_{fast}$ 761, its frequency control word $F_{slow}$ takes the value of $F_{slow}=(I-1)+r=49+r$. This leads to $T_2=(49+r)\cdot\Delta$. The Vernier factor is N=I/(1-r)=49/(1-r). The rest of parameters are the same as that of the previous case.

In this case, we assume $n_1=n_2=n$. Under this setting, we measure smaller TOFs. In other words, we only study the fractional portion of the measurement (since the integer portion is straightforward and it is already understood in previous case). We further assume $f_{GRO}$=200 MHz ($N_{cal}$=6103). Under this condition, from (11), we have $\tau=(1-r)\cdot n/(K\cdot N_{cal}\cdot f_{cal})$. In this example, the fraction r in the frequency control word is chosen in such way that the values of $1-r$ are $2^0, 2^{-1}, 2^{-8}, 2^{-16}$, and $2^{-24}$, respectively. According to equation (7), the Vernier factor is set to be 50, 100, 12800, 3276800 and 838860800, respectively. It is expected that the time resolution on measuring TOF will be greatly enhanced with large Vernier factor. The numbers given in table III confirm this predication.

TABLE III

TOF measurements from TAF-DPS Vernier caliper configuration #2

| | n = 10 | n = 100 | n = 1000 | n = 10000 |
|---|---|---|---|---|
| $(1-r) = 2^0$ | $\tau = 10\Delta$ | $\tau = 100\Delta^+$ | $\tau = 1000\Delta^+$ | $\tau = 10000\Delta^+$ |
| $\to N = 50$ | 1.56 ns | 15.6 ns | 156 ns | 1.56 us |
| $(1-r) = 2^{-1}$ | $\tau = 5\Delta$ | $\tau = 50\Delta^+$ | $\tau = 500\Delta^+$ | $\tau = 5000\Delta^+$ |
| $\to N = 100$ | 0.78 ns | 7.8 ns | 78 ns | 780 ns |
| $(1-r) = 2^{-8}$ | $\tau = 0.0390625\Delta$ | $\tau = 0.390625\Delta$ | $\tau = 3.90625\Delta$ | $\tau = 39.0625\Delta$ |
| $\to N = 12800$ | 0.6 ps | 6 ps | 60 ps | 600 ps |
| $(1-r) = 2^{-16}$ | $\tau = 0.000152588\Delta$ | $\tau = 0.001525879\Delta$ | $\tau = 0.015258789\Delta$ | $\tau = 0.152587891\Delta$ |
| $\to N = 3276800$ | 0.02 ps | 0.2 ps | 2 ps | 20 ps |
| $(1-r) = 2^{-24}$ | $\tau$ = 5.96046E-07$\Delta$ | $\tau$ = 5.96046E-06$\Delta$ | $\tau$ = 5.96046E-05$\Delta$ | $\tau = 0.000596046\Delta$ |
| $\to N = 838860800$ | 0.09 fs | 0.9 fs | 9 fs | 90 fs |

$^+$These values are invalid (not produced from the counters) since they are greater than $T_1 \to$ n value is not realistic for this Vernier factor setting.

In configuration #1, the frequency control words for the TAF-DPS$_{slow}$ and TAF-DPS$_{fast}$ are $F_{slow}$=I=50 and $F_{fast}$=I-1=49, respectively. This results in the main scale of $T_1=50\cdot\Delta$ and the Vernier scale of $T_2=49\cdot\Delta$. The Vernier factor is 50. In configuration #2, taking the case of $1-r=2^{-8}$ for example, $F_{slow}$=I=50 and $F_{fast}$=I-1+$2^{-8}$=49.00390625. Thus, the Vernier factor is 12800. In this case, the main scale is still $T_1=50\cdot\Delta$. The Vernier scale is not fixed; it varies. For every 256 ($=2^8$) cycles in Vernier scale, there are 255 $T_{2\_A}$=49·$\Delta$ and one $T_{2\_B}$=50·$\Delta$. In average, the size of Vernier scale is $T_2$=49.00390625·$\Delta$. As a result, it can reach a fine measurement resolution.

Figure 8:
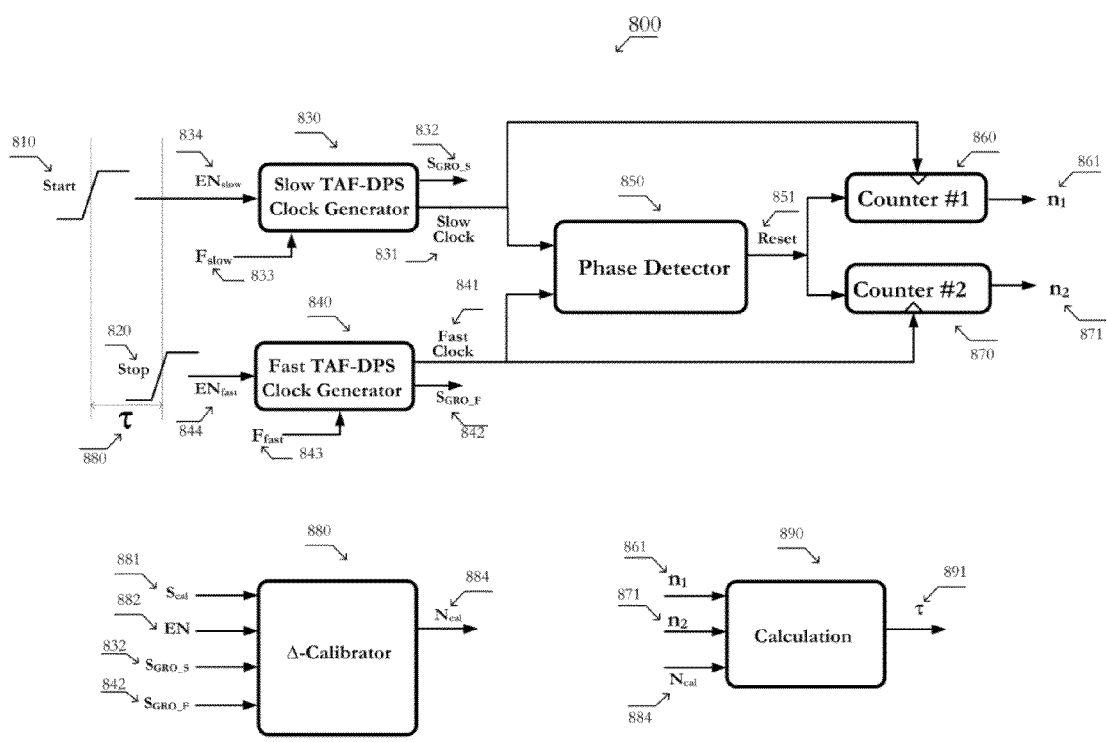
FIG. 8 is an electrical diagram, in block form, illustrating an embodiment of present invention of using TAF-DPS Vernier caliper to measure TOF.

Refer now to FIG. 8, an embodiment of present invention of using TAF-DPS Vernier caliper 800 to measure TOF will now be explained. A Slow TAF-DPS Clock Generator 830 has two inputs: EN$_{slow}$ 834 for enabling its oscillation and F$_{slow}$ 833 for controlling its output frequency (period). It has two outputs: Slow Clock 831 generated from TAF-DPS frequency synthesizer and S$_{GRO\_S}$ 832 generated from GRO. Slow TAF-DPS Clock Generator 830 is the TAF-DPS clock generator 750 described in FIG. 7. S$_{GRO\_S}$ 832 can be one of the members from the plurality of K outputs. EN$_{slow}$ 834 is connected to the signal Start 810. A Fast TAF-DPS Clock Generator 840 has two inputs: EN$_{fast}$ 844 for enabling its oscillation and F$_{fast}$ 843 for controlling its output frequency (period). It has two outputs: Fast Clock 841 generated from TAF-DPS frequency synthesizer and S$_{GRO\_S}$ 842 generated from GRO. Fast TAF-DPS Clock Generator 840 is the TAF-DPS clock generator 760 described in FIG. 7. S$_{GRO\_F}$ 842 can be one of the members from the plurality of K outputs. EN$_{fast}$ 844 is connected to the signal Stop 820.

Both Slow Clock 831 and Fast Clock 841 are fed to phase detector 850. Slow Clock 831 and Fast Clock 841 are also used to drive Counter #1 860 and Counter #2 870, respectively. Phase detector 850 has an output Reset 851 that is used to control the Counter #1 860 and Counter #2 870. Signal Reset 851 becomes active when point-of-coincidence is detected. The point-of-coincidence is reached when the edges of Slow Clock 831 and Fast Clock 841 are aligned. At this moment, the contents of Counter #1 860 and Counter #2 870 are read out and stored in registers as values $n_1$ 861 and $n_2$ 871, respectively. The counters are subsequently reset.

System 800 has a block of Δ-Calibrator 880 for calibrating the base time unit Δ. It has four inputs: EN 882 for enabling the Δ-Calibrator 880; $S_{cal}$ 881 for receiving a reference signal of known frequency; $S_{GRO\_S}$ 832 and $S_{GRO\_F}$ 842 are fed into Δ-Calibrator 880 for being calibrated. EN 882 can connect to Reset 851 or other user-controlled signals. $S_{cal}$ 881 comes from external source of known frequency $f_{cal}$. As an example, it could be a 32.768 KHz real time clock. Δ-Calibrator 880 has an output $N_{cal}$ 884 whose value can be derived by using equation (10). In the process of calculating $N_{cal}$, either signal $S_{GRO\_S}$ 832 or $S_{GRO\_F}$ 842 can be used to count against the reference signal $S_{cal}$ 881. In some case, both signals $S_{GRO\_S}$ 832 and $S_{GRO\_F}$ 842 can be used and the $N_{cal}$ 884 can be the derived from the average of the results obtained.

System 800 has another block of Calculation 890 for calculating the TOF measurement result. From the values of $n_1$ 861, $n_2$ 871, $N_{cal}$ 884, $f_{cal}$ and the integer value I used in $F_{slow}$ and $F_{fast}$, equation (11) can be used to derive the TOF value τ 891.

Figure 9:
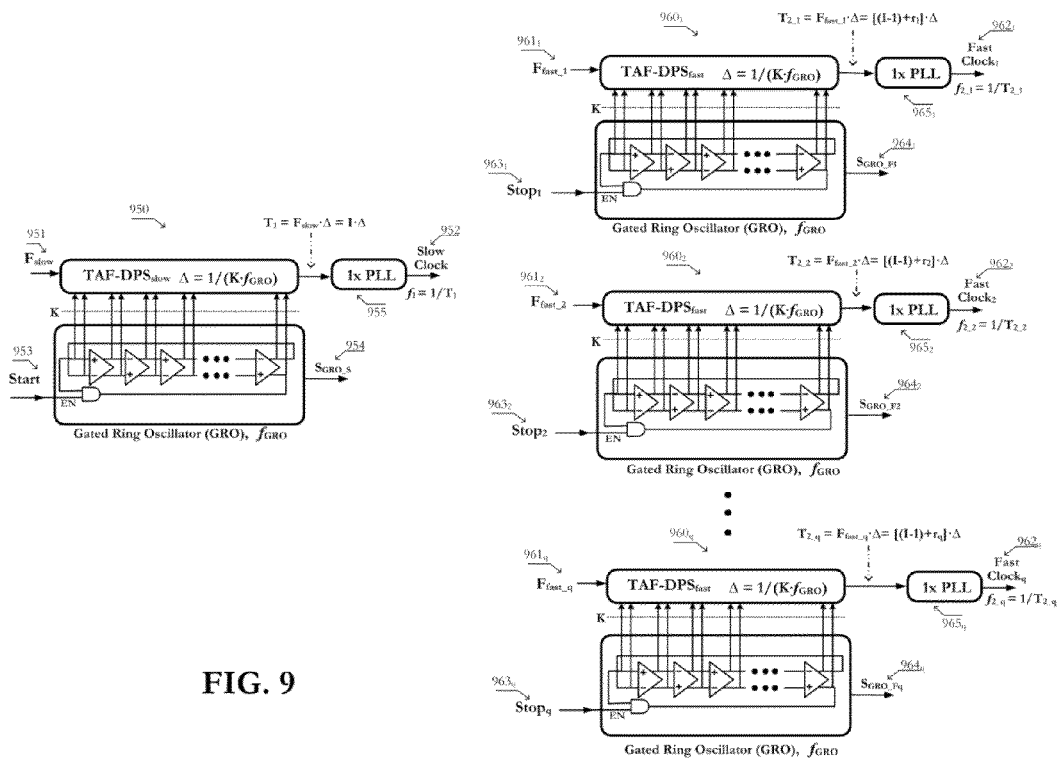
FIG. 9 is an electrical diagram, in block form, illustrating another embodiment of present invention of using TAF-DPS Vernier caliper to create a clock signal of first frequency and a plurality of clock signals of second frequency.

Refer now to FIG. 9, a plurality of fast clocks can be generated by using a plurality of GROs and TAF-DPS$_{fast}$s. Clock generator 950 is used to create the signal Slow Clock 952. Its frequency control word is $F_{slow}$ 951. Its output frequency (period) is $1/f_1=T_1=F_{slow}\cdot\Delta=I\cdot\Delta$ where I is an integer of greater than one. The signal Slow Clock 952 is enabled by signal Start 953. A plurality of q Fast Clock signals $962_1$, $962_2$, ..., $962_q$ are created by a plurality of q clock generators $960_1$, $960_2$, ..., $960_q$, respectively, where q is an integer of greater than zero. Said plurality of q clock generators use a plurality of q frequency control words $F_{fast\_1}$ $961_1$, $F_{fast\_2}$ $961_2$, ..., $F_{fast\_q}$ $961_q$ to control their output frequencies. Said plurality of q frequency control words take the values of $F_{fast\_i}=[(I-1)+r_i]$ where $r_i$ is a fraction in range of [0,1), i=1, 2, ..., q. As a result, said plurality of q Fast Clock signals $962_1$, $962_2$, ..., $962_q$ have output frequencies (periods) $1/f_{2\_i}=T_{2\_i}=F_{fast\_i}\cdot\Delta=[(I-1)+r_i]\cdot\Delta$, i=1, 2, ..., q. Said plurality of q clock generators $960_1$, $960_2$, ..., $960_q$ are enabled by signal $Stop_1$ $963_1$, $Stop_2$ $963_2$, ..., $Stop_q$ $963_q$, respectively. In certain case, signals $Stop_1$ $963_1$, $Stop_2$ $963_2$, ..., $Stop_q$ $963_q$ can all be connected to one signal and frequency control words $F_{fast\_1}$ $961_i$, $F_{fast\_2}$ $961_2$, ..., $F_{fast\_q}$ $961_q$ can all take the same value.

Figure 10:
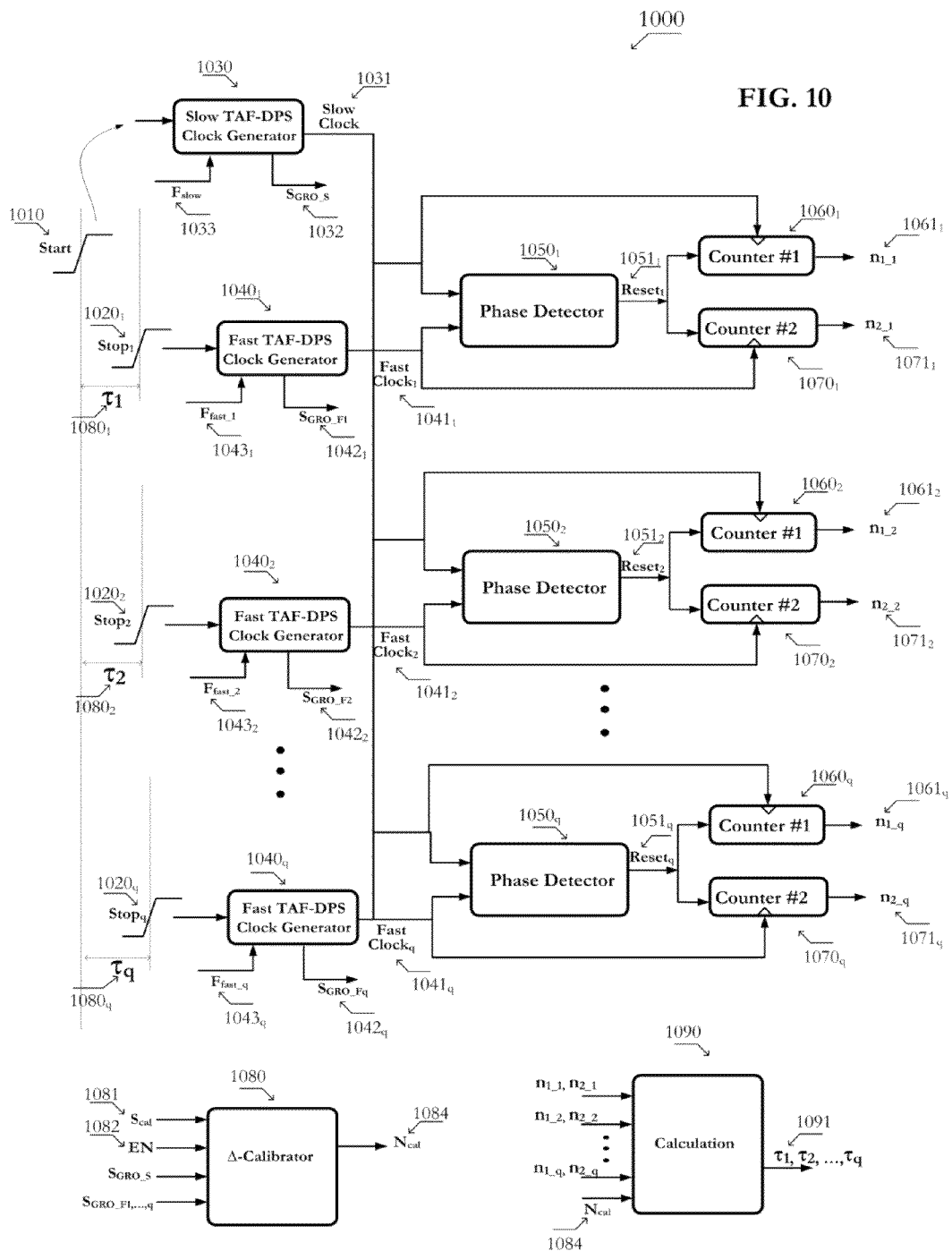
FIG. 10 is an electrical diagram, in block form, illustrating another embodiment of present invention of using TAF-DPS Vernier caliper of a plurality of clock signals of second frequency to measure TOF.

Refer now to FIG. 10, another embodiment of using one slow clock signal and multiple fast clock signals according to present invention is described in system 1000. A plurality of q fast clock generators $1040_1$, $1040_2$, ..., $1040_q$ are paired with a slow clock generator 1030. The oscillations of said plurality of q fast clock generators $1040_1$, $1040_2$, ..., $1040_q$ are enabled by signals $Stop_1$ $1020_1$, $Stop_2$ $1020_2$, ..., $Stop_q$ $1020_q$. The output frequencies of said plurality of q fast clock generators $1040_1$, $1040_2$, ..., $1040_q$ are controlled by a plurality of q frequency control words $F_{fast\_1}$ $1043_1$, $F_{fast\_2}$ $1043_2$, ..., $F_{fast\_q}$ $1043_q$. The slow clock 1031 and a plurality of q fast clock $1041_1$, $1041_2$, ..., $1041_q$ are paired and fed to a plurality of q phase detectors $1050_1$, $1050_2$, ..., $1050_q$. The phase detectors' outputs Reset $1051_1$, $1051_2$, ..., $1051_q$ are used to control a plurality of q counter pairs $1060_1$, $1070_1$, $1060_2$, $1070_2$, ..., $1060_q$, $1070_q$. Said plurality of q counter pairs produce outputs of $\{n_{1\_1}, n_{2\_1}\}$, $\{n_{1\_2}, n_{2\_2}\}$, ..., $\{n_{1\_q}, n_{2\_q}\}$, which can be used in equation (11) to derive a plurality of q TOF results 1091 $\tau_1, \tau_2, \ldots, \tau_q$.

To improve the accuracy of TOF measurement, using system 1000, duplication of Fast Clock signals can be used to generate a group of T values that correspond to one pair of Start and Stop signals. In this case, signals $Stop_1$ $1020_1$, $Stop_2$ $1020_2$, ..., $Stop_q$ $1020_q$ will all be connected to one signal Stop 1020 and frequency control words $F_{fast\_1}$ $1043_1$, $F_{fast\_2}$ $1043_2$, ..., $F_{fast\_q}$ $1043_q$ all take the same value. The final τ value can be derived as the average of the said plurality of q τ values. In certain case, the maximum and minimum τ values of said plurality of q τ values can be eliminated from the calculation. The average can be derived from the rest of T values in the set. In some other cases, signals $Stop_1$ $1020_1$, $Stop_2$ $1020_2$, ..., $Stop_q$ $1020_q$ can connect to multiple different Stop signals so that a group of TOF measurements can be accomplished. Further, in certain cases, each of the frequency control words $F_{fast\_1}$ $1043_1$, $F_{fast\_2}$ $1043_2$, ..., $F_{fast\_q}$ $1043_q$ can take its own value so that several different configurations can be implemented in said plurality of q fast clock generators $1040_1$, $1040_2$, ..., $1040_q$. This approach is useful for certain applications.

System 1000 also has a Δ-Calibrator block 1080. It performs the same function as those described in system 800. Signal EN 1082 can be one selected from the set of {Reset$_1$, Reset$_2$, ..., Reset$_q$} or other user-controlled signals. Signal $S_{cal}$ 1081 comes from a reference signal source of known frequency. The $S_{GRO\_S}$ 1032 and the set of signals {$S_{GRO\_F1}$, $S_{GRO\_F2}$, ..., $S_{GRO\_Fq}$} are all fed into Δ-Calibrator block 1080. In the process of calibration, one of them can be used to count against the reference. In some cases, several of them can be used to count against the reference and the final result of $N_{cal}$ 1084 can be derived from the averaging.

System 1000 also has a Calculation block 1090. It takes the outputs $\{n_{1\_1}, n_{2\_1}\}$, $\{n_{1\_2}, n_{2\_2}\}$, ..., $\{n_{1\_q}, n_{2\_q}\}$ from said plurality of q counter pairs. It also takes output $N_{cal}$ 1084 from Δ-Calibrator block 1080. It uses equation (11) to derive a plurality of q TOF results 1091 $\tau_1, \tau_2, \ldots, \tau_q$.

Exemplary Method of Using TAF-DPS Vernier Caliper to Measure TOF

The present invention further relates to a method of using TAF-DPS Vernier caliper to measure TOF. The method generally comprises the steps of (1) using gated ring oscillator and TAF-DPS and 1×PLL to create a slow clock signal generator and a fast clock signal generator; 2) setting the clock frequencies (periods) of said slow clock signal and fast clock signal to $1/f_1=T_1=I\cdot\Delta$ and $1/f_2=T_2=[(I-1)+r]\cdot\Delta$, respectively, where I is an integer of greater than one and r is a fraction in range of [0,1); 3) starting the slow clock generator from the rising (or falling) edge of a Start signal, starting the fast clock generator from the rising (or falling) edge of a Stop signal; 4) feeding the slow clock signal and the fast clock signal to a phase detector, driving a first digital counter by said slow clock signal, driving a second digital counter by said fast clock signal; 5) generating a Reset signal from said phase detector by detecting point-of-coincidence; 6) reading out the contents of said digital counters and then reset the digital counters; 7) calibrating the frequency of gated ring oscillator by comparing its output to a signal of known frequency; 8) calculating TOF between the Start and Stop signals from the contents of said digital counters and the calibrated frequency of gated ring oscillator.

Figure 11:
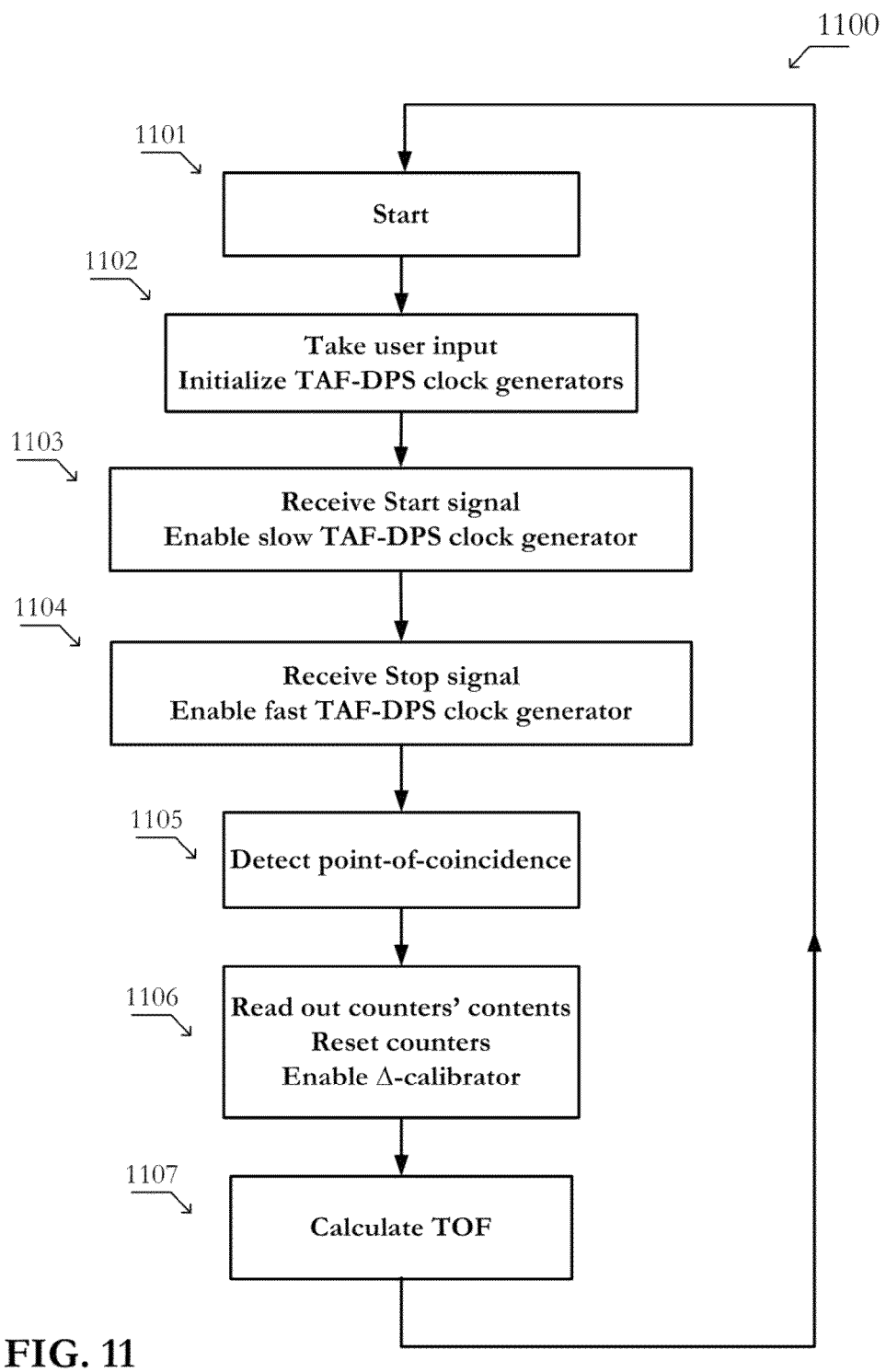
FIG. 11 is the procedure illustrating the steps of using TAF-DPS clock generators to measure TOF according to present invention.

Refer now to FIG. 11, the procedure of steps of using TAF-DPS Vernier caliper to measure TOF between signals Start and Stop will now be described. Procedure 1100 starts from the step of Start 1101. In step 1102, the system takes input from user and initializes the TAF-DPS clock generators.

In step 1103, the slow TAF-DPS clock generator is enabled by signal Start. In step 1104, the fast TAF-DPS clock generator is enabled by signal Stop. In step 1105, the point-of-coincidence is detected. After the point-of-coincidence is reached, the counters' contents are read out in step 1106 and the counters are subsequently reset. In step 1106, the Δ-calibrator is started. In step 1107, all the parameters are available and the calculation is carried out to derive the value τ of TOF measurement. After the calculation is accomplished, the flow returns back to step 1101 and is ready for next measurement.

CONCLUSION/SUMMARY

Thus, the present invention provides circuits and methods to accurately measure TOF between two electrical signals. The present invention can reach measurement accuracy far beyond the gate delay of one buffer/inverter. The present invention uses Time-Average-Frequency direct period synthesizer to create the slow and fast clock signals. Thus, the present invention advantageously utilizes the TAF-DPS clock generator's capabilities of arbitrary frequency generation. Theoretically, it can result in any measurement accuracy giving appropriate resource and enough measurement time.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

[1] L. Xiu, "*Nanometer Frequency Synthesis beyond Phase Locked Loop*," August 2012, John Wiley IEEE press.

What is claimed is:

1. A system of measuring Time-of-Flight (TOF) between signal transitions of two electrical signals by using two clock generators, comprising:
   a first input for receiving a first electrical signal;
   a second input for receiving a second electrical signal;
   a third input for receiving a frequency control word $F_{slow}$;
   a fourth input for receiving a frequency control word $F_{fast}$;
   a fifth input for receiving an electrical signal of known frequency;
   a sixth input for receiving an enable signal;
   an output for delivering TOF measurement result;
   a slow TAF-DPS (Time-Average-Frequency Direct Period Synthesis) clock generator for generating a slow clock signal, having a first input for receiving said first electrical signal, having a second input for receiving said frequency control word $F_{slow}$, having a first output for delivering said slow clock signal, having a second output for delivering an electrical signal for calibration;
   a fast TAF-DPS clock generator for generating a fast clock signal, having a first input for receiving said second electrical signal, having a second input for receiving said frequency control word $F_{fast}$, having a first output for delivering said fast clock signal, having a second output for delivering an electrical signal for calibration;
   a phase detector for detecting point-of-coincidence, having a first input for receiving said slow clock signal, having a second input for receiving said fast clock signal, having an output for delivering a reset signal;
   a first digital counter, having a clock input for receiving said slow clock signal, having a reset input for receiving said reset signal from said phase detector; having an output for outputting its content;
   a second digital counter, having a clock input for receiving said fast clock signal, having a reset input for receiving said reset signal from said phase detector; having an output for outputting its content;
   a calibration block, having an enable input for receiving a signal from said sixth input, having a calibration input for receiving a signal from said fifth input, having a first oscillation input for receiving signal from said second output of slow TAF-DPS clock generator, having a second oscillation input for receiving signal from said second output of fast TAF-DPS clock generator, having an output for delivering calibration result;
   a calculation block, having a first input for receiving a first digital value, having a second input for receiving a second digital value, having a third input for receiving a third digital value, having an output for delivering calculation result;
   wherein said output of said calculation block is connected to said output;
   wherein said output of first digital counter is connected to said first input of said calculation block;
   wherein said output of second digital counter is connected to said second input of said calculation block;
   wherein said output of calibration block is connected to said third input of said calculation block.

2. The system of claim 1, wherein said slow TAF-DPS clock generator comprises:
   a gated ring oscillator (GRO) for generating a plurality of K phase-evenly-spaced signals where K is an integer of greater than one, having an enable input for receiving said first electrical signal, having an output for delivering said plurality of K phase-evenly-spaced signals, comprising:
     a plurality of delay stages configured as a ring oscillator, outputs from said delay stages form said plurality of K phase-evenly-spaced signals;
     an enable cell for controlling electrical oscillation of said GRO, having an input pin for receiving signal from said enable input;
   a TAF-DPS frequency synthesizer for generating a slow TAF clock signal, having a first input for receiving said plurality of K phase-evenly-spaced signals from said GRO, having a second input for receiving said frequency control word $F_{slow}$, having an output for delivering said slow TAF clock signal;
   a 1×PLL for generating said slow clock signal, having an input for receiving said slow TAF clock signal from said TAF-DPS frequency synthesizer as reference input of the PLL, having an output for delivering said slow clock signal, said 1×PLL is configured in a way that frequency ratio of said input and said output is one.

3. The system of claim 2, wherein said TAF-DPS frequency synthesizer comprises:
   a first K→1 multiplexer, having a multi-bit reference input for receiving said plurality of K phase-evenly-spaced signals, having a control input, having an output;
   a second K→1 multiplexer, having a multi-bit reference input for receiving said plurality of K phase-evenly-spaced signals, having a control input, having an output;
   a 2→1 multiplexer, having a first input for receiving the output from said first K→1 multiplexer, having a second input for receiving the output from said second K→1 multiplexer, having a control input, having an output;

a toggle flip-flop for generating a pulse train, comprises:
- a D-type flip-flop, having a clock input for receiving output from the output of said 2→1 multiplexer, having a data input, having an output for outputting a CLK1 signal;
- an inverter, having an input for receiving said CLK1 signal, having an output for outputting a CLK2 signal;
- wherein said CLK2 signal is connected to said data input of said D-type flip-flop;
- wherein said CLK1 signal contains said pulse train;

a control logic block, having a first input for receiving said frequency control word, having a second input for receiving said phase adjustment control word, having a third input for receiving said enable signal, having a fourth input for receiving said CLK1 signal, having a fifth input for receiving said CLK2 signal, having a first output connected to said control input of said first K→1 multiplexer, having a second output connected to said control input of said second K→1 multiplexer;

wherein said CLK1 signal is connected to the control input of said 2→1 multiplexer;

wherein said CLK1 signal is outputted as said slow TAF clock signal.

4. The system of claim 1, wherein said frequency control word $F_{slow}$ is set in form of $F_{slow}=I$ where I is an integer in range of [2, 2K].

5. The system of claim 1, wherein said fast TAF-DPS clock generator comprises:
- a gated ring oscillator (GRO) for generating a plurality of K phase-evenly-spaced signals where K is an integer of greater than one, having an enable input for receiving said second electrical signal, having an output for delivering said plurality of K phase-evenly-spaced signals, comprising:
  - a plurality of delay stages configured as a ring oscillator, outputs from said delay stages form said plurality of K phase-evenly-spaced signals;
  - an enable cell for controlling electrical oscillation of said GRO, having an input pin for receiving signal from said enable input;
- a TAF-DPS frequency synthesizer for generating a fast TAF clock signal, having a first input for receiving said plurality of K phase-evenly-spaced signals from said GRO, having a second input for receiving said frequency control word $F_{fast}$, having an output for delivering said fast TAF clock signal;
- a 1×PLL for generating said fast clock signal, having an input for receiving said fast TAF clock signal from said TAF-DPS frequency synthesizer as reference input of the PLL, having an output for delivering said fast clock signal, said 1×PLL is configured in a way that frequency ratio of said input and said output is one.

6. The system of claim 5, wherein said TAF-DPS frequency synthesizer comprises:
- a first K→1 multiplexer, having a multi-bit reference input for receiving said plurality of K phase-evenly-spaced signals, having a control input, having an output;
- a second K→1 multiplexer, having a multi-bit reference input for receiving said plurality of K phase-evenly-spaced signals, having a control input, having an output;
- a 2→1 multiplexer, having a first input for receiving the output from said first K→1 multiplexer, having a second input for receiving the output from said second K→1 multiplexer, having a control input, having an output;
- a toggle flip-flop for generating a pulse train, comprises:
  - a D-type flip-flop, having a clock input for receiving output from the output of said 2→1 multiplexer, having a data input, having an output for outputting a CLK1 signal;
  - an inverter, having an input for receiving said CLK1 signal, having an output for outputting a CLK2 signal;
  - wherein said CLK2 signal is connected to said data input of said D-type flip-flop;
  - wherein said CLK1 signal contains said pulse train;

a control logic block, having a first input for receiving said frequency control word, having a second input for receiving said phase adjustment control word, having a third input for receiving said enable signal, having a fourth input for receiving said CLK1 signal, having a fifth input for receiving said CLK2 signal, having a first output connected to said control input of said first K→1 multiplexer, having a second output connected to said control input of said second K→1 multiplexer;

wherein said CLK1 signal is connected to the control input of said 2→1 multiplexer;

wherein said CLK1 signal is outputted as said fast TAF clock signal.

7. The system of claim 1, wherein said frequency control word $F_{fast}$ is set in form of $F_{fast}=(I-1)+r$ where r is a fraction in range of [0, 1).

8. A system of measuring Time-of-Flight (TOF) between signal transitions of two electrical signals by using a plurality of clock generators, comprising:
- a first input for receiving an electrical signal Start;
- a second multi-bit input for receiving a plurality of q electrical signals $Stop_1, Stop_2, \ldots, Stop_q$ where q is an integer of greater than zero;
- a third input for receiving a frequency control word $F_{slow}$;
- a fourth multi-bit input for receiving a plurality of q frequency control word $F_{fast\_1}, F_{fast\_2}, \ldots, F_{fast\_q}$;
- a fifth input for receiving an electrical signal of known frequency;
- a sixth input for receiving an enable signal;
- a multi-bit output for delivering TOF measurement result;
- a slow TAF-DPS clock generator for generating a slow clock signal, having a first input for receiving said Start signal, having a second input for receiving said frequency control word $F_{slow}$, having a first output for delivering said slow clock signal, having a second output for delivering an electrical signal for calibration;
- a plurality of q fast TAF-DPS clock generators for generating a plurality of q fast clock signals, each said fast TAF-DPS clock generator having a first input for receiving a Stop signal from said second multi-bit input, each said fast TAF-DPS clock generator having a second input for receiving a frequency control word $F_{fast}$ from said fourth multi-bit input, each said fast TAF-DPS clock generator having a first output for delivering a fast clock signal, each said fast TAF-DPS clock generator having a second output for delivering an electrical signal for calibration;
- a plurality of q phase detectors for detecting a plurality of q point-of-coincidences, each said phase detector having a first input for receiving said slow clock signal, each said phase detector having a second input for receiving a said fast clock signal from one of said q fast TAF-DPS clock generators, each said phase detector having an output for delivering a reset signal;
- a plurality of q first digital counters, each said first digital counter having a clock input for receiving said slow clock signal, each said first digital counter having a reset input for receiving a said reset signal from one of said q phase detectors;
each said first digital counter having an output for outputting its content;
a plurality of q second digital counters, each said second digital counter having a clock input for receiving a said fast clock signal from one of said q fast TAF-DPS clock generators, each said second digital counter having a reset input for receiving a reset signal from one of said q phase detectors, each said second digital counter having an output for outputting its content;
a calibration block, having an enable input for receiving a signal from said sixth input, having a calibration input for receiving a signal from said fifth input, having a first oscillation input for receiving signal from said second output of said slow TAF-DPS clock generator, having a multi-bit second oscillation input for receiving signals from said second outputs of said plurality of q fast TAF-DPS clock generators, having an output for delivering calibration result;
a calculation block, having a plurality of q first inputs for receiving a plurality of q first digital values, having a plurality of q second inputs for receiving a plurality of q second digital values, having a third input for receiving a third digital value, having a multi-bit output for delivering calculation result;
wherein said multi-bit output of calculation block is connected to said multi-bit output;
wherein said output of each said first digital counter is connected to each said first input of calculation block;
wherein said output of each said second digital counter is connected to each said second input of calculation block;
wherein said output of calibration block is connected to said third input of calculation block.

9. The system of claim 8, wherein said slow TAF-DPS clock generator comprises:
a gated ring oscillator (GRO) for generating a plurality of K phase-evenly-spaced signals where K is an integer of greater than one, having an enable input for receiving said first electrical signal, having an output for delivering said plurality of K phase-evenly-spaced signals, comprising:
a plurality of delay stages configured as a ring oscillator, outputs from said delay stages form said plurality of K phase-evenly-spaced signals;
an enable cell for controlling electrical oscillation of said GRO, having an input pin for receiving signal from said enable input;
a TAF-DPS frequency synthesizer for generating a slow TAF clock signal, having a first input for receiving said plurality of K phase-evenly-spaced signals from said GRO, having a second input for receiving said frequency control word $F_{slow}$, having an output for delivering said slow TAF clock signal;
a 1×PLL for generating said slow clock signal, having an input for receiving said slow TAF clock signal from said TAF-DPS frequency synthesizer as reference input of the PLL, having an output for delivering said slow clock signal, said 1×PLL is configured in a way that frequency ratio of said input and said output is one.

10. The system of claim 8, wherein said frequency control word $F_{slow}$ is set in form of $F_{slow}=I$ where I is an integer in range of [2, 2K].

11. The system of claim 8, wherein each said fast TAF-DPS clock generator comprises:

a GRO for generating a plurality of K phase-evenly-spaced signals where K is an integer of greater than one, having an enable input for receiving said second electrical signal, having an output for delivering said plurality of K phase-evenly-spaced signals, comprising:
a plurality of delay stages configured as a ring oscillator, outputs from said delay stages form said plurality of K phase-evenly-spaced signals;
an enable cell for controlling electrical oscillation of said GRO, having an input pin for receiving signal from said enable input;
a TAF-DPS frequency synthesizer for generating a fast TAF clock signal, having a first input for receiving said plurality of K phase-evenly-spaced signals from said GRO, having a second input for receiving said frequency control word $F_{fast}$, having an output for delivering said fast clock signal;
a 1×PLL for generating said fast clock signal, having an input for receiving said fast TAF clock signal from said TAF-DPS frequency synthesizer as reference input of the PLL, having an output for delivering said fast clock signal, said 1×PLL is configured in a way that frequency ratio of said input and said output is one.

12. The system of claim 8, wherein said frequency control word $F_{fast\_i}$ is set in form of $F_{fast\_i}=(I-1)+r_i$ where $r_i$ is a fraction in range of [0, 1), i=1, 2, . . . , q.

13. A method of measuring TOF between signal transitions of a first and a second electrical signals, comprising the steps of:
receiving a first electrical signal;
receiving a plurality of q second electrical signals where q is an integer of greater than zero;
creating a slow clock signal generator and a plurality of q fast clock signal generators by using gated ring oscillators and TAF-DPS frequency synthesizers and 1×PLLs;
configuring said slow clock signal generator by using a frequency control word $F_{slow}$ so that its output frequency (period) is set to be $1/f_1=T_1=F_{slow}\cdot\Delta=I\cdot\Delta$ where $\Delta$ is a base time unit and I is an integer of greater than one, configuring said fast clock signal generators by using a plurality of frequency control word $F_{fast\_i}$ so that their output frequencies (periods) are set to be $1/f_{2\_i}=T_{2\_i}=F_{fast\_i}\cdot\Delta=[(I-1)+r_i]\cdot\Delta$, and $r_i$ is a fraction in range of [0,1), i=1, 2, . . . , q;
starting the slow clock generator from rising (or falling) edge of said first electrical signal and generating a slow clock signal, starting each fast clock generator of said plurality of q fast clock generators from rising (or falling) edge of a second electrical signal from said plurality of q second electrical signals, generating a plurality of q fast clock signals from said q fast clock generators;
feeding said slow clock signal and said plurality of q fast clock signals to a plurality of q phase detectors, driving a plurality of q first digital counters by said slow clock signal, driving each one of a plurality of q second digital counters by a said fast clock signal from said plurality of q fast clock signals;
generating a plurality of q reset signals from said phase detectors by detecting a plurality of q point-of-coincidences, reading out contents of said plurality of q first and second digital counters after said plurality of q reset signals are received by said plurality of q first and second digital counters and then resetting said digital counters;
calibrating the frequency of said gated ring oscillators;
calculating TOFs between said first and a plurality of q second electrical signals.

14. The method of claim 13, wherein the creating of said slow clock signal generator comprises the steps of:
creating a first input for receiving said first electrical signal, creating a second input for receiving said frequency control word $F_{slow}$ for configuring output frequency of said slow clock signal generator, creating a first output for delivering generated clock signal, creating a second output for delivering a signal for calibration, comprising the steps of:
creating a plurality of K phase-evenly-spaced signals by using said gated ring oscillator where K is an integer of greater than one, oscillation of said gated ring oscillator is controlled by said first electrical signal;
generating a slow TAF clock signal by using a TAF-DPS synthesizer, said TAF-DPS synthesizer uses said plurality of K phase-evenly-spaced signals as its input, said TAF-DPS synthesizer uses said frequency control word $F_{slow}$ to synthesize a clock frequency for said slow TAF clock signal;
generating said slow clock signal by using a 1×PLL, said 1×PLL uses said slow TAF signal as its reference input, output of said 1×PLL is said slow clock signal, said 1×PLL is configured in a way that frequency ratio of said input and said output is one.

15. The method of claim 13, wherein the creating of each one of said plurality of q fast clock signal generators comprises the steps of:
creating a first input for receiving a second electrical signal from said plurality of q second electrical signals, creating a second input for receiving a frequency control word $F_{fast\_i}$ from said plurality of q frequency control words for configuring output frequency of said fast clock signal generator, creating a first output for delivering generated clock signal, creating a second output for delivering a signal for calibration, comprising the steps of;
creating a plurality of K phase-evenly-spaced signals by using said gated ring oscillator where K is an integer of greater than one, oscillation of said gated ring oscillator is controlled by said second electrical signal;
generating a fast TAF clock signal by using TAF-DPS synthesizer, said TAF-DPS synthesizer uses said plurality of K phase-evenly-spaced signals as its input, said TAF-DPS synthesizer uses said frequency control word $F_{fast\_i}$ to synthesize a clock frequency for said fast TAF clock signal;
generating said slow clock signal by using a 1×PLL, said 1×PLL uses said fast TAF signal as its reference input, output of said 1×PLL is said fast clock signal, said 1×PLL is configured in a way that frequency ratio of said input and said output is one.

16. The method of claim 13, wherein the detection of a plurality of q point-of-coincidence is accomplished by comparing rising (or falling) edges of said slow clock signal and each one of said plurality of q fast clock signals, said plurality of q point-of-coincidence are reached when said edges are aligned in time, respectively.

17. The method of claim 13, wherein calibration of gated ring oscillator frequency is accomplished by counting the number of gated ring oscillator's oscillation cycles within p cycles of a reference signal of known frequency where p is an integer of greater than zero and calibration result is stored in $N_{cal}$, TOF calculation is carried out by using $\tau=[(n_1-n_2)\cdot I+(1-r)\cdot n_2]/(K\cdot N_{cal}\cdot f_{cal})$ where $n_1$ and $n_2$ are outputs of said first and second digital counters, respectively, $f_{cal}$ is frequency of said reference signal.

18. The method of claim 17, wherein the calibrating of the frequency of gated ring oscillator comprises the step of:
calibrating m number of gated ring oscillators and producing $N_{cal\_1}, N_{cal\_2}, \ldots, N_{cal\_m}$ where m is an integer of greater than zero;
deriving calibration result $N_{cal}$ by $N_{cal}=\Sigma(N_{cal\_i})/m$, $i=1, 2, \ldots, m$.

19. The method of claim 18, wherein the calculation of $N_{cal\_i}$ of a said gated ring oscillator comprises the step of:
counting the number of oscillations of said gated ring oscillator within p cycles of a reference signal of known frequency;
deriving calibration result $N_{cal\_i}$ from dividing said number of oscillations by p.

* * * * *